United States Patent [19]
Seguro et al.

[11] Patent Number: 5,903,463
[45] Date of Patent: May 11, 1999

[54] RAISING-AND-LOWERING DATA SETTING METHOD FOR MAGAZINE ELEVATOR DEVICE

[75] Inventors: Masayuki Seguro, Higashimurayama; Yoshimitsu Terakado, Hachiouji; Toru Mochida, Higashiyamato, all of Japan

[73] Assignee: Kabushiki Kaisha Shinkawa, Tokyo, Japan

[21] Appl. No.: 08/862,133

[22] Filed: May 22, 1997

[30] Foreign Application Priority Data

May 24, 1996 [JP] Japan .................................. 8-151849

[51] Int. Cl.$^6$ .................................. B65G 1/00; B65G 1/04
[52] U.S. Cl. ...................... 364/478.02; 414/331; 414/609
[58] Field of Search ..................... 414/331, 936, 414/937, 609; 364/478.02, 478.05; 360/92; 369/36, 34

[56] References Cited

U.S. PATENT DOCUMENTS

| | | | |
|---|---|---|---|
| 4,457,662 | 7/1984 | Ireland et al. | 414/331 |
| 4,770,590 | 9/1988 | Hugues et al. | 414/937 |
| 4,996,436 | 2/1991 | Doeuvne et al. | 250/560 |
| 5,003,188 | 3/1991 | Igari | 250/561 |
| 5,044,752 | 9/1991 | Thurfjell et al. | 356/400 |
| 5,315,107 | 5/1994 | Smith et al. | 250/222.2 |
| 5,475,604 | 12/1995 | Nagamatsu | 364/478.02 |
| 5,501,565 | 3/1996 | Fujino et al. | 414/331 |
| 5,588,791 | 12/1996 | Akagawa | 414/331 |
| 5,605,428 | 2/1997 | Birkner et al. | 414/331 |
| 5,628,605 | 5/1997 | Miyoshi | 414/331 |
| 5,664,679 | 9/1997 | Schneider | 206/711 |
| 5,772,386 | 6/1998 | Mages et al. | 414/411 |

FOREIGN PATENT DOCUMENTS 1-32127  6/1989  Japan .

*Primary Examiner*—James W. Keenan
*Assistant Examiner*—Isobel A. Parker
*Attorney, Agent, or Firm*—Koda & Androlia

[57] ABSTRACT

A data, which is used for raising-and-lowering a magazine holder on which a magazine for storing articles such as lead frames is placed in a magazine elevator device, being set by the steps of: placing a magazine on the magazine holder, storing in a memory the number of article storing sections of this magazine, aligning the lowermost article storing section of the magazine with the level of a lead frame conveying path by moving the magazine holder, storing in the memory the positional data of the thus moved magazine holder, aligning the uppermost article storing section of the magazine with the level of the frame conveying path by further moving the magazine holder, and then storing in the memory the data of the thus further moved magazine holder.

2 Claims, 5 Drawing Sheets

5,903,463

RAISING-AND-LOWERING DATA SETTING METHOD FOR MAGAZINE ELEVATOR DEVICE

BACKGROUND OF THE INVENTION

1. Field of the Invention

The present invention relates to a data setting method and more particularly to a method for setting data used for raising and lowering a magazine by an elevator means during the manufacture of, for instance, semiconductor devices.

2. Prior Art

Generally, as shown in FIG. 4, in an assembly machine used in the manufacture of semiconductors, particularly in a bonding apparatus such as a wire bonding apparatus and a die bonding apparatus, a loader side magazine 2A and an unloader side magazine 2B are respectively installed at either end of a conveying path 1 of a feeder means for a workpiece (including lead frames, wafers, semiconductor substrates, etc.), and these magazines 2 (2A, 2B) are positioned and carried on the respective magazine holders 4 of the loader side elevator device 3A and the unloader side elevator device 3B. A bonding apparatus 5 such as a wire bonding apparatus, a die bonding apparatus, etc. is installed on one side of the conveying path 1.

The following description will be made with reference to a case wherein lead frames are processed.

In the above described structure, lead frames 6 stored in the loader side magazine 2A are pushed out onto the frame conveying path 1 by a pusher 7. Each lead frame 6 that is pushed out onto the conveying path 1 is conveyed to the working position (for instance, a bonding position) 1a by a feeder means (not shown), and bonding is performed by the bonding apparatus 5. When the bonding is completed, the lead frame 6 is conveyed by the feeder means and accommodated in the unloader side magazine 2B.

FIG. 5 shows one type of magazine used in the system above for storing workpieces, that is, lead frames, therein. The magazine has a plurality of article storing sections 2a though 2g so that a plurality of lead frames are accommodated in the magazines 2 (2A, 2B) in a stacked fashion with a fixed spacing in between. Thus, each time a lead frame is fed onto the conveying path 1 (see FIG. 1) from the loader side magazine 2A, or each time a lead frame is accommodated in the unloader side magazine 2B from the conveying path 1, the respective magazine 2 (2A or 2B) is lowered by one pitch, so that the article storing section of the magazine 2 (2A or 2B) which stores the next lead frame to be fed out or which stores the next lead frame to be fed thereinto is positioned at the level of the conveying path 1.

If two or more magazines 2 (2A or 2B) are placed in a stacked configuration on the magazine holder 4 of each elevator device 3 (3A or 3B), when the last lead frame has been fed out of the uppermost article storing section 2g of the loader side magazine 2A or when the last lead frame has been fed into the uppermost article storing section 2g of the unloader side magazine 2B at the level of the conveying path, then it is necessary to further lower the magazine 2 (2A or 2B) so that the lowermost storing section 2a of the next magazine is positioned at the level of the conveying path 1.

One example of such a magazine conveying device is disclosed in Japanese Patent Application Publication (Kokoku) No. 1-32127.

In this device, as seen from FIG. 6, an article storing section/position detecting plate 130 is attached to a magazine holder 104 of the elevator device 100. Magazines 150A, 150B, 150C are set on the magazine holder 104 of this elevator device 100. This storing section position detecting plate 130 has a slit group as shown in FIG. 7, which comprises a plurality of slits 130a and a separated slit 130b. The slits 130a are formed at the same pitch and number as the number of the article storing sections of the magazine, and the separated slit 130b is formed above the slits 130a with a distance equal to the distance between the uppermost article storing section of a first magazine (150A) to the lowermost article storing section of a second magazine (150B) which is placed on the first magazine. Furthermore, a photo sensor 133 is provided for detecting the slits 130a and 130b of the detecting plate 130. The elevator device 100 further includes an externally threaded screw shaft 114 installed uprightly and driven by a motor 118. The magazine holder 104 is provided with an internally threaded screw which is engaged with the externally threaded screw shaft 114 so that the magazine holder 104 is raised and lowered when the externally threaded screw shaft 114 is rotated by the motor 118. The reference numeral 135 is a lower limit switch that detects the magazine holder 104 reached to its lowest moving point.

In this prior art, each time the article storing section of the magazine comes to the conveying path level 132 by way of the lowering movement of the magazine holder 104 that holds the magazine thereon, an article (for example, a lead frame) is fed out of (or fed into) the magazine, and this movement of the magazine holder 104 is detected by the photo sensor 133 that faces the slits 130a and 130b of the detecting plate 130 attached to the magazine holder 104.

As seen from the above, it is necessary to use the article storing section position detecting plate 130 which is specially designed (particularly with regard to the number of the slits) for each type of the magazine to be handled. Furthermore, when there is a change in magazines due to a change in the type of product (lead frames, wafers, etc.) to be worked on the positional relationship between the article storing section position detecting plate 130 and the photo sensor 133 must be adjusted.

In addition, the magazine holder raising and lowering elements (including the screw shaft 114 and others) that render the magazine holder 104 to move up and down customarily have working errors and assembly errors. Accordingly, the elevator device inevitably contains a positional deviation error in raising and lowering the magazine holder 104.

SUMMARY OF THE INVENTION

Accordingly, the first object of the present invention is to provide a method for setting raising-and-lowering data for a magazine elevator device that can raise and lower a magazine without any need for a position detecting plate nor detection photo sensors.

The second object of the present invention is to provide a method for setting raising-and-lowering data for a magazine elevator device that can set data compensating a positional deviation error of a magazine holder that is characteristic of each elevator device.

The third object of the present invention is to provide a method for setting raising-and-lowering data for a magazine elevator device that allows an easy, quick and accurate magazine exchange.

The objects are accomplished by a unique method of the present invention that comprises the steps of: placing a magazine on a magazine holder of an elevator device, storing a number equal to the number of article storing sections of the magazine in a data memory, aligning the lowermost article storing section of the magazine with a level of a conveying path by moving the magazine holder, storing in the data memory the positional data of the magazine holder when the lowermost article storing section of the magazine is thus aligned with the level of the conveying path, aligning the uppermost article storing section of the magazine with the level of the conveying path by moving the magazine holder, and then storing in the data memory the positional data of the magazine holder when the uppermost article storing section of the magazine is thus aligned with the level of the conveying path.

The objects are accomplished by another unique method of the present invention that comprises the steps of: placing a magazine on a magazine holder of an elevator device, storing a number equal to the number of article storing sections of the magazine in a data memory, aligning the lowermost article storing section of the magazine with a level of a conveying path by moving the magazine holder, storing in the data memory the positional data of the magazine holder when the lowermost article storing section of the magazine is thus aligned with the level of the conveying path, aligning the uppermost article storing section of the magazine with the level of the conveying path by moving the magazine holder, and storing in the data memory the positional data of the magazine holder when the uppermost article storing section of the magazine is thus aligned with the level of the conveying path, and further placing a second magazine on top of the first magazine, aligning the lowermost article storing section of the second magazine with the level of the conveying path by moving the magazine holder, and then storing the positional data of the magazine holder when the lowermost article storing section of the second magazine is thus aligned with the level of the conveying path.

DETAILED DESCRIPTION OF THE INVENTION

One embodiment of the present invention will be described with reference to FIGS. 1 through 3, and references are also made to FIGS. 4 and 5. The embodiment will be explained based partly on the magazine exchanging apparatus disclosed in Japanese Patent Application Publication (Kokoku) No. 1-32127. The magazine guide groove position detecting plate 130 (an article storing section position detecting plate) and lead frame position detecting photo sensor 133 which is installed so as to face the magazine guide groove position detecting plate 130 disclosed in this Japanese publication are not employed in the present invention. The magazine used in the embodiment of the present invention is the one shown in FIG. 5.

Figure 2:
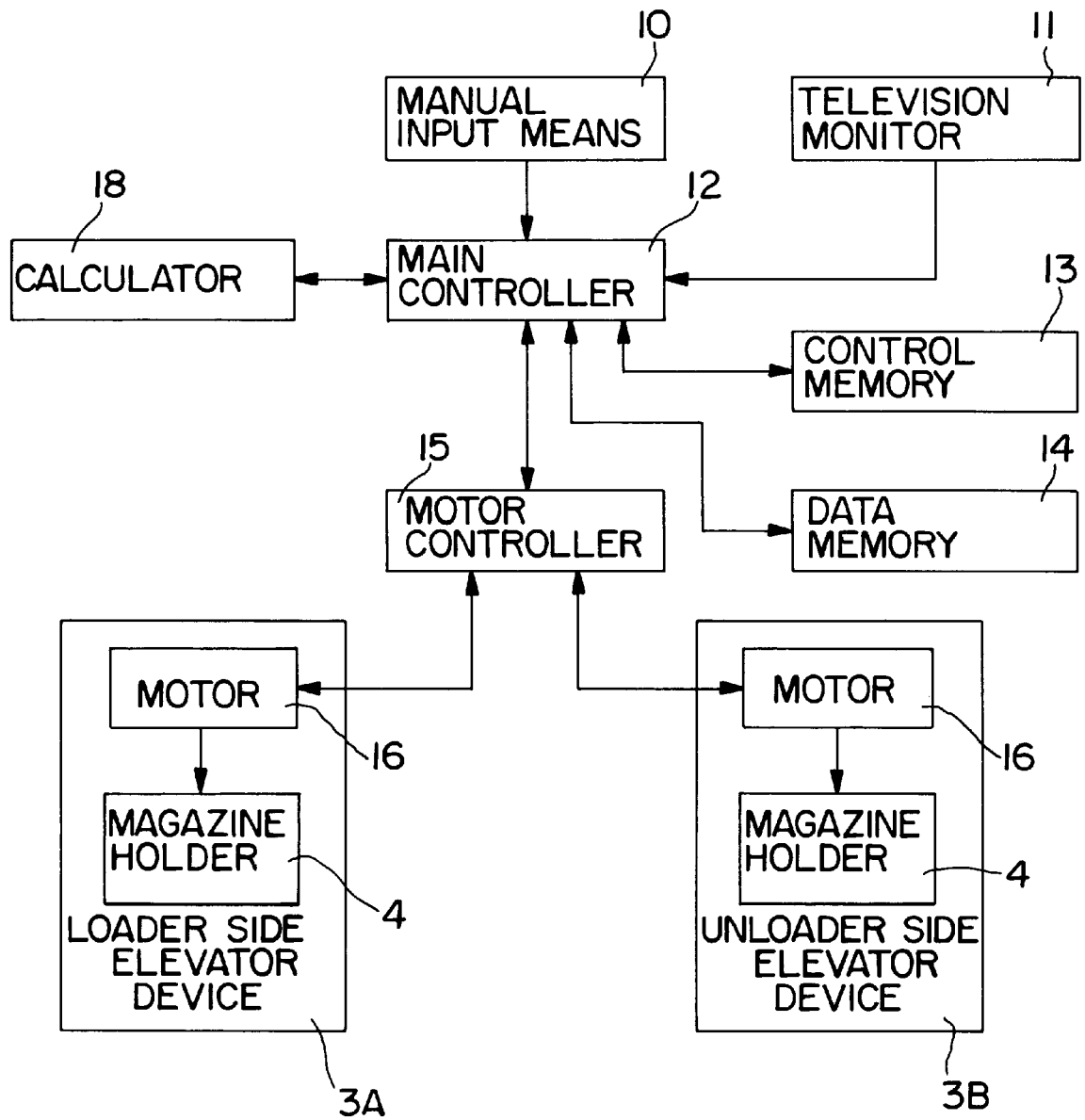
FIG. 2 is a block diagram of the control circuit used in the method.
Figure 3:
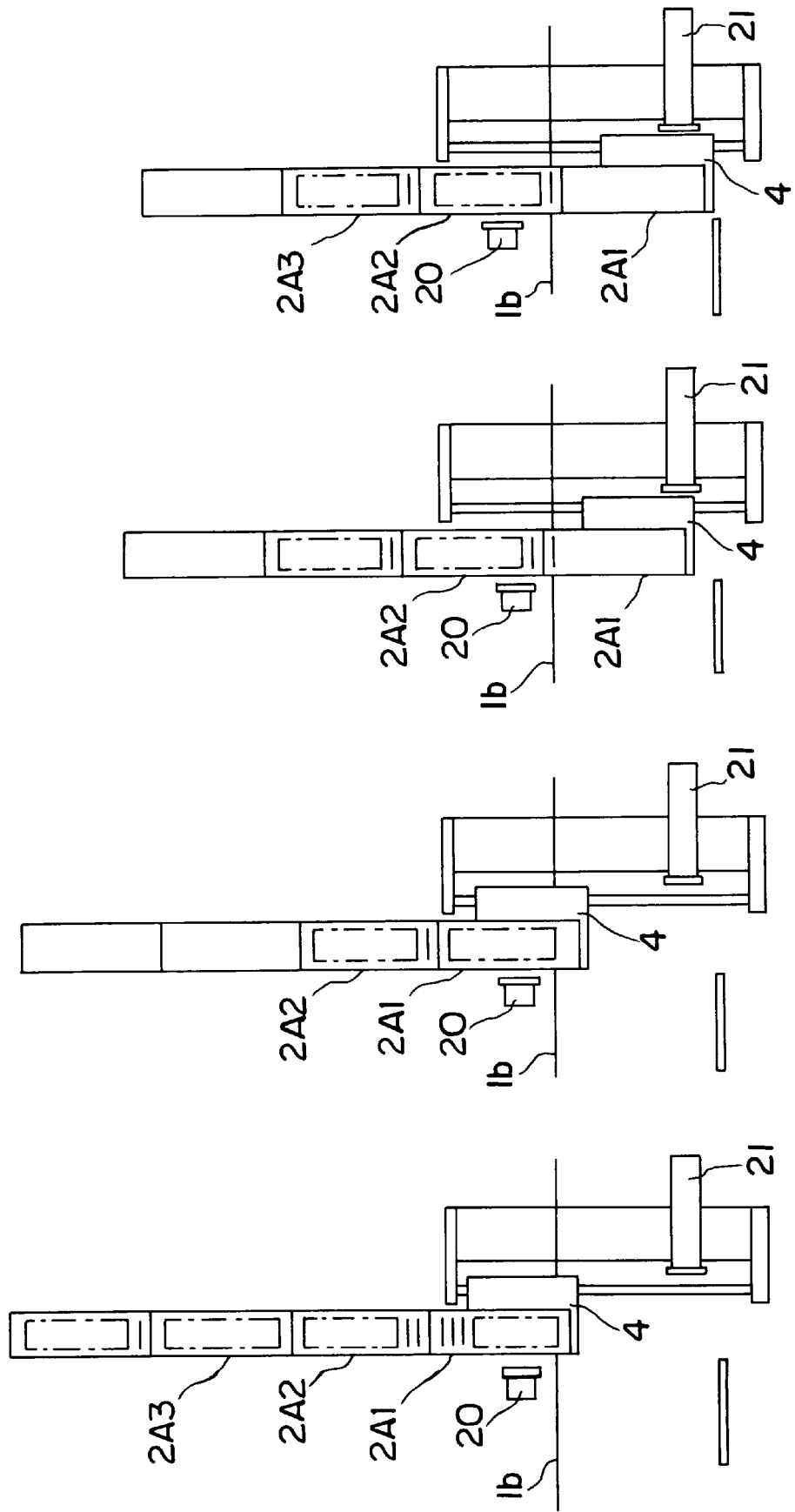
FIG. 3 is an explanatory diagram showing the steps of the movement of the magazine and magazine holder.

Using a manual input means 10 as shown in FIG. 2, which is a digital swish, a numeral key pad, or other appropriate devices, the "Loader Side" of the magazine exchange mode displayed on the screen of a television monitor 11 is selected. As a result, data input conditions stored in a control memory 13 are displayed on the television monitor 11 via a main controller 12. Then, the number n equal to the number of the article storing sections 2a, 2b . . . 2g of the magazine 2 (see FIG. 5) is inputted using the manual input means 10. In other words, since the magazine 2 of this embodiment shown in FIG. 5 has seven (7) article storing sections 2a though 2g (into which workpiece, or lead frames, are accommodated), this number 7 (or n=7) is inputted into the main controller 12 via the manual input means 10. The data of this number n (=7) is stored in a data memory 14 via the main controller 12.

Next, the "Magazine Exchange Start" displayed on the television monitor 11 is selected via the manual input means 10. When this selection is made, a starting point search mode stored in the control memory 13 is called up by the main controller 12, and the main controller 12 causes the motor 16 of the loader side elevator device 3A to activate via a motor controller 15; as a result, the magazine holder 4 is moved to the starting point. The starting point of the magazine holder 4 in this embodiment is where the magazine holder 4 is fully lowered, which is the position where the lower limit switch (135) described in the referred prior art publication is switched on. Accordingly, when the motor 16 is thus rotated so that the magazine holder 4 is lowered, and when the lower limit switch (135) is switched on, the rotational position of the motor 16 at the time of the "ON" signal of the lower limit switch, i. e., the position of the magazine holder 4, is stored in the data memory 14 as the starting point 17. The position of the magazine holder 4 in this state is indicated by a solid line in FIG. 1(a).

Figures 1A, 1B:
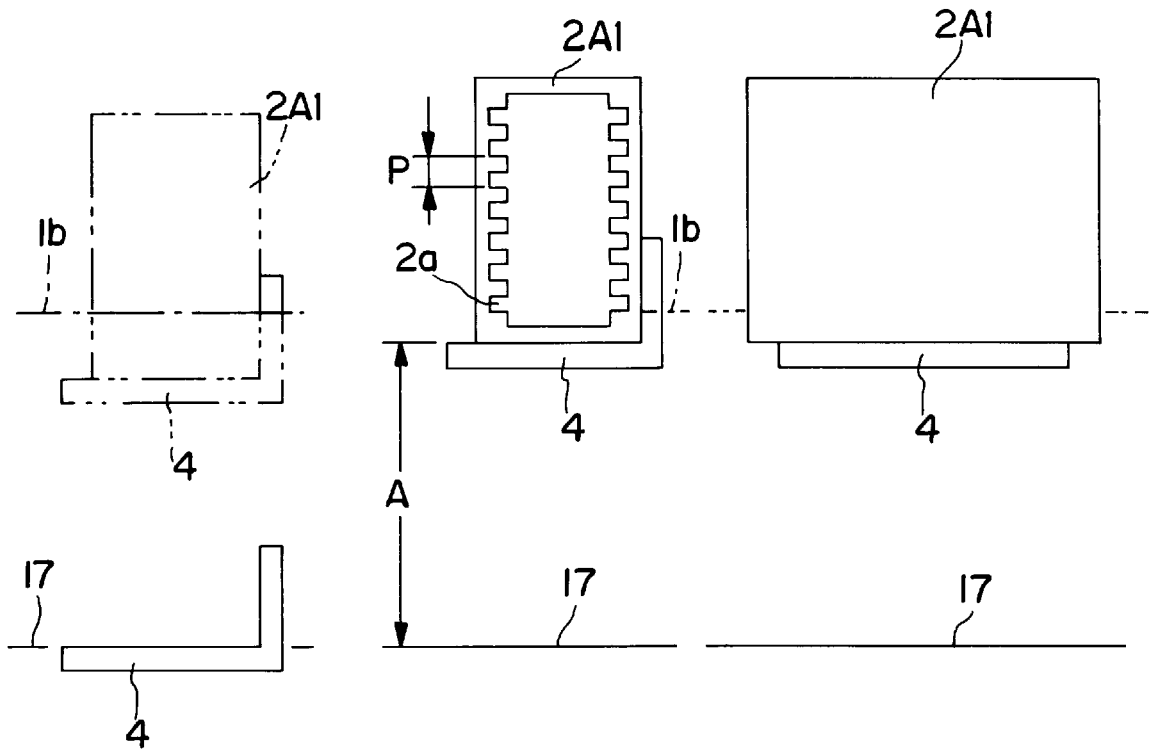
FIG. 1 illustrates steps of the method for setting raising-and-lowering data for a magazine elevator device according to one embodiment of the present invention; in which each of FIGS. 1(a), 1(b), 1(c) and 1(d) shows the magazine and magazine holder viewed from the conveying path level.

Furthermore, the control memory 13 of the present embodiment is programed so that when the lower limit switch (135) is switched on, the magazine holder 4 is raised to the vicinity of the level 1b (see FIG. 1) which represents a frame conveying path 1. This setting is made in order to shorten the time required in the operation shown in FIG. 1(b), which will be described next. More specifically, after the starting point 17 is detected as shown in FIG. 1(a), the motor 16 is activated in the reverse direction so that the magazine holder 4 is raised as shown by the two-dot chain line in FIG. 1(a). Then, the magazine 2A1 that is to be used is placed and positioned on the magazine holder 4.

Next, using the digital switches of the manual input means 10, the motor 16 is driven so that the magazine holder 4 is raised, and then the lowermost article storing section 2a of the magazine 2A1 is aligned with the frame conveying path level 1b as shown in FIG. 1(b). Afterward, the "Set" button of the manual input means 10 is pressed, so that the rotational position of the motor 16 at this time, i. e., the height A (or the positional data) of the magazine holder 4 for the lowermost storing section of the magazine 2A1 placed on the magazine holder 4 and aligned with the conveying path level 1b, is stored in the data memory 14 via the main controller 12.

Figure 1C:
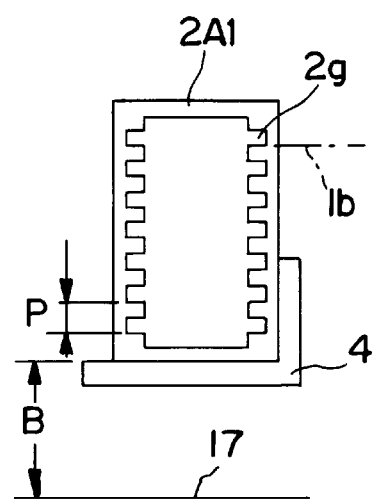

Then, in the same manner as described above, the motor 16 is driven using the digital switches of the manual input means 10 so as to lower the magazine holder 4, and then the uppermost article storing section 2g of the magazine 2A1 is aligned with the frame conveying path level 1b as shown in FIG. 1(c). Afterward, by pressing the "Set" button of the manual input means 10, the rotational position of the motor 16 at this time, i. e., the height B (or the positional data) of the magazine holder 4 for the uppermost storing section of the magazine 2A1 placed on the magazine holder 4 and aligned with the conveying path level 1b, is stored in the data memory 14 via the main controller 12.

Figure 1D:
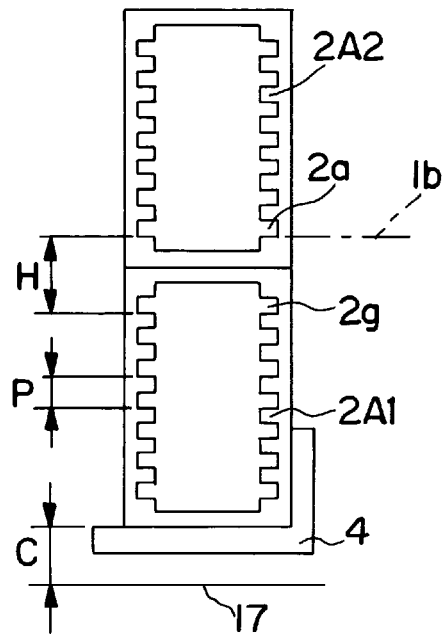

Next, a magazine 2A2 is set on top of the magazine 2A1 as shown in FIG. 1(d). Then, in the same manner as described above, the motor 16 is driven via the digital switches of the manual input means 10 so that the magazine holder 4 is lowered. Then, the lowermost article storing section 2a of the magazine 2A2 is aligned with the frame conveying path level 1b as shown in FIG. 1(d). Afterward, when the "Set" button of the manual input means 10 is pressed, the rotational position of the motor 16 at this time, i. e., the height C.(or the positional data) of the magazine holder 4 for the lowermost article storing section of the magazine 2A2 placed on the magazine 2A1 and aligned with the conveying path level 1b, is stored in the data memory 14 via the main controller 12.

With use of Equation 1 and Equation 2 shown below, the pitch P of the article storing sections and the distance H which is from the uppermost article storing section 2g of the magazine 2A1 to the lowermost article storing section 2a of the magazine 2A2 (see FIG. 1(d)) can be calculated from the height data A, B and C obtained by the method described above and from the number n which is the number equal to the number of the article storing sections 2a, 2b . . . 2g of each magazine 2:

$$P=(A-B)/(n-1) \quad \text{Equation 1}$$

$$H=B-C \quad \text{Equation 2}$$

Then, when the "Data Input Complete" button of the manual input means 10 is pressed, a calculator 18 calculates the values of P and H from Equations 1 and 2 via the main controller 12. In other words, the calculator 18 obtains P and H by Equations 1 and 2 based upon the data n, A, B and C stored in the data memory 13 in accordance with a program stored in the control memory 13, and the resulting values of P and H are stored in the data memory 14. With this operation, the setting of the magazine data for the loader side elevator device 3A is completed.

The data n, A, B and C are set for the unloader side elevator device 3B as well by means of substantially the same steps as for the loader side elevator device 3A described above.

Figure 4:
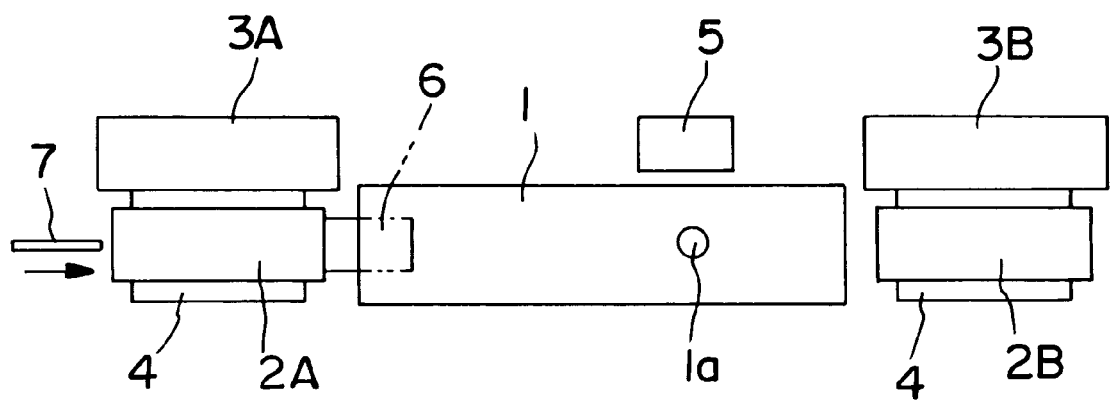
FIG. 4 is a schematic top view illustrating a lead frame feeding and accommodating apparatus used in a bonding apparatus.
Figure 5:
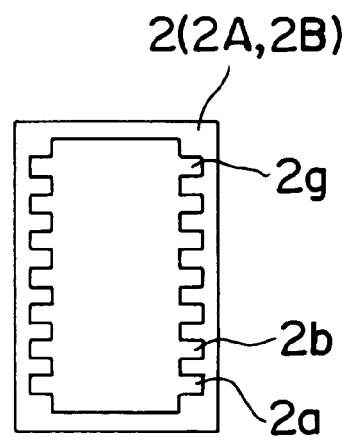
FIG. 5 is a front view of a magazine used in the lead frame feeding and accommodating apparatus.
Figures 6, 7:
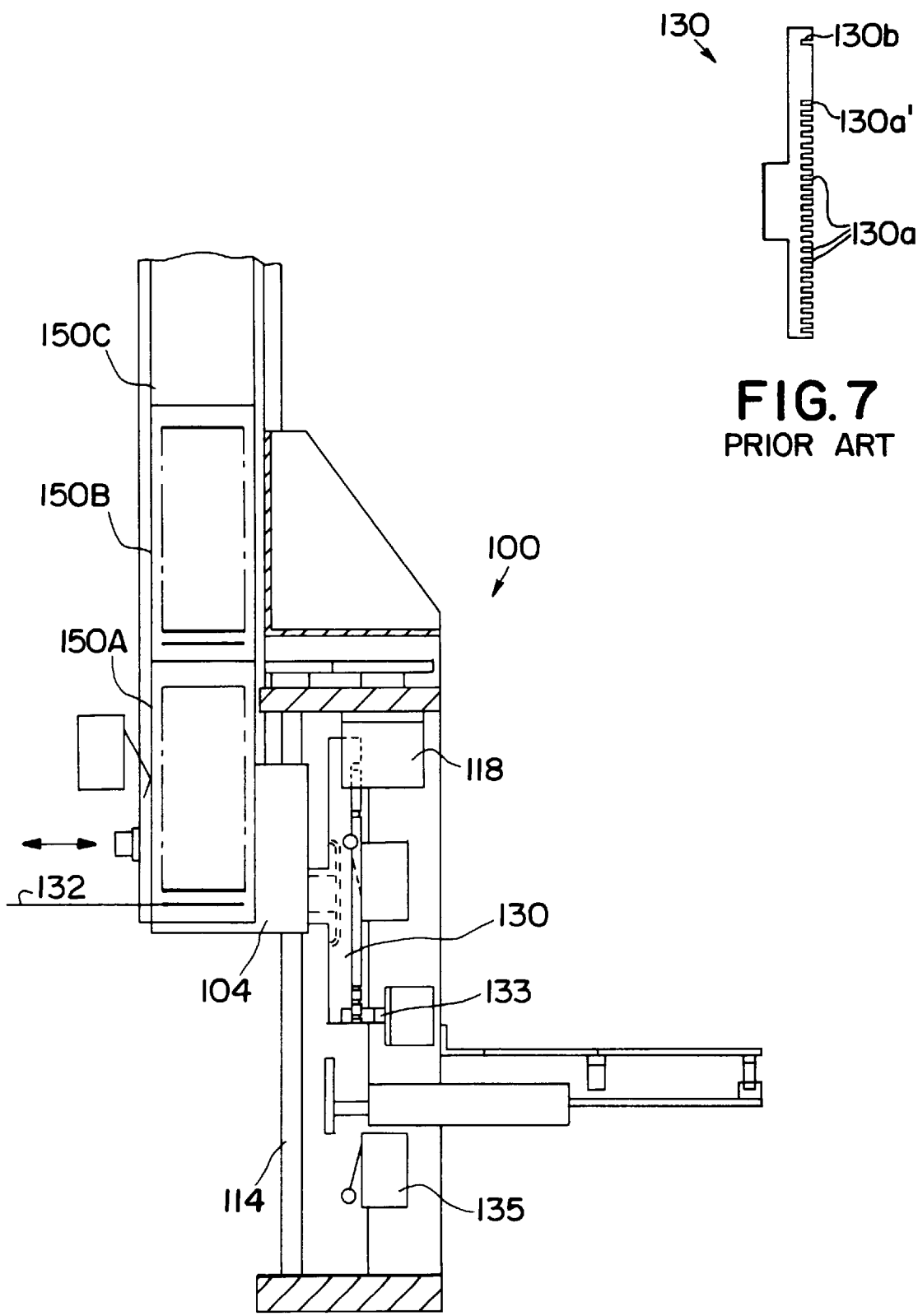
FIG. 6 shows a conventional magazine exchange apparatus.
FIG. 7 shows a magazine guide groove position detecting plate used in the apparatus of FIG. 6.

In cases where the type of magazine to be handled is changed, it is necessary to input the data of the length of the new magazine type so as to re-set the operating range of the frame pusher 7 shown in FIG. 4. However, since this operation has little connection with the gist of the present invention, a detailed explanation is omitted.

The operation of the loader side elevator device 3A will be described with reference to FIG. 3. In FIG. 3, the reference numeral 20 indicates a magazine damper and 21 indicates a magazine pusher.

When the "Magazine Set" button (not shown) is pressed, the main controller 12 (see FIG. 2) reads out the height level data A stored in the data memory 14 and drives the motor 16 via the motor controller 15 so that the magazine holder 4 with a magazine thereon is moved to the position of height A. In this state, as shown in FIG. 3(a), magazines 2A1, 2A2 . . . which contain lead frames are within vertical magazine guides (not shown) and stacked on the magazine holder 4. In this state, the lowermost lead frame in the article storing section 2a of the lowermost magazine 2A1 is positioned at the conveying path level 1b.

When the apparatus is operated, the frame pusher 7 (see FIG. 4) is actuated, and the lowermost lead frame inside the magazine 2A1 is fed out onto the frame conveying path 1. When the lead frame is thus fed out, the motor 16 is actuated by a frame feed-out detection switch (not shown) so that the magazine holder 4 is lowered by one pitch P by the data stored in the data memory 14, thus causing the next lead frame to be positioned at the conveying path level 1b as shown in FIG. 3(b). Afterward, the magazine holder 4 is lowered by one pitch P each time that a lead frame is fed out as described above.

The operation described above is successively repeated until the uppermost lead frame inside in the uppermost article storing section 2g of the magazine 2A1 is positioned at the conveying path level 1b as shown in FIG. 3(c) and fed out by the frame pusher 7. In other words, at this point, the lead frame feed-out operation has been performed a number of times that is equal to the number n of the article storing sections of the magazine 2A1 which is stored in the data memory 14.

Following the completion of these frame feed-out operations for the magazine 2A1, the magazine holder 4 is further lowered by an amount equal to the distance H which is stored in the data memory 14 and is equal to the distance between the uppermost article storing section 2g of the magazine 2A1 to the lowermost article storing section 2a of the magazine 2A2. As a result, the lowermost lead frame inside the lowermost storing section 2a of the magazine 2A2 is positioned at the conveying path level 1b as shown in FIG. 3(d), so that the lowermost lead frame is ready to be fed out.

The lowermost lead frame inside the magazine 2A2 is fed out and conveyed to a working position (bonding position) by the frame feeder, and bonding is performed on this lead frame. Before a signal indicates that the lead frame from the magazine 2A2 is fed to the working position, the magazine 2A1 is put aside by the operation described in the referred Japanese Publication No. 1-32127. When the discharge of the magazine 2A1 is finished, the magazine holder 4 is raised by a distance equal to the first storing section height A, and the magazines 2A2, 2A3 . . . are stacked on the magazine holder 4, and the lead frames stored inside the magazines 2A2, 2A3 . . . are successively fed out by the operation illustrated in FIGS. 3(a) through 3(d).

On the unloader side elevator device 3B, empty magazines 2 are stacked on the magazine holder 4 of the unloader side elevator device 3B. The operation on the unloader side elevator device 3B differs from the loader side elevator device 3A in that lead frames are successively fed into the empty magazines 2 (and not fed out from the fill magazine) on the unloader side elevator device 3B.

As seen from the above, according to the present invention, the data setting for raising-and-lowering the elevator devices that is required for magazine exchange is accomplished by successively performing:

a step of storing in a data memory the number equal to the number of the storing sections of a first magazine placed on the magazine holder, a step of aligning the lowermost storing section of the first magazine placed on the magazine holder with the conveying path level by moving the magazine holder and then storing in the data memory the data of the magazine holder thus moved, a step of aligning the uppermost storing section of the first magazine with the conveying path level by moving the magazine holder and then storing in the data memory the data of the magazine holder thus moved, and a step of aligning the lowermost article storing section of a second magazine placed on top of the first magazine with the conveying path level and then storing in the data memory the data of the magazine holder thus moved.

In other words, an article storing section position detecting plate (130) and a photo sensor (133) for detecting this detecting plate which are used in the conventional method are not necessary in the present invention. Furthermore, according to the present invention, it is possible to set data which includes the positional deviation error of magazine holders that is characteristic of the individual elevator device involved. Moreover, since the operation to store the positions of the magazine holder needs to be performed only once, system setting can be accomplished quickly, easily and accurately.

In the above embodiment, a plurality of magazines are placed one on the other. However, the present invention is applicable when the magazines are not stacked. In this case, however, it goes without saying that there is no need to perform a setting operation for the height data C as shown in FIG. 1(d).

We claim:

1. A method for setting raising-and-lowering data for a magazine elevator device comprising the steps of:

placing a magazine on a magazine holder of an elevator device;

storing in a memory means a number (n) equal to the number of article storing sections of said magazine;

aligning a lowermost article storing section of said magazine with a level of a conveying path;

storing in said memory means a positional data (A) of said magazine holder at a time of said alignment of said lowermost article storing section;

aligning an uppermost article storing section of said magazine with said level of said conveying path;

storing in said memory means a positional data (B) of said magazine holder at a time of said alignment of said uppermost article storing section;

calculating a pitch (P) of the article storing sections from the equation:

$$P=(A-B)/(n-1)$$

wherein P=the pitch of the article storing sections, A=positional data of said magazine holder at a time of said alignment of said lowermost article storing section, B=positional data of said magazine holder at a time of said alignment of said uppermost storing section and n=a number equal to the number of article storing sections of said magazine; and storing the pitch (P) in said memory means.

2. A method for setting raising-and-lowering data for a magazine elevator device comprising the steps of:

placing a magazine on a magazine holder of an elevator device;

storing in a memory means a number (n) equal to the number of article storing sections of said magazine;

aligning a lowermost article storing section of said magazine with a level of a conveying path;

storing in said memory means a positional data (A) of said magazine holder at a time of said alignment of said lowermost article storing section;

aligning an uppermost article storing section of said magazine with said level of said conveying path;

storing in said memory means a positional data (B) of said magazine holder at a time of said alignment of said uppermost article storing section;

placing another magazine on top of said magazine;

aligning a lowermost article storing section of said another magazine with said level of said conveying path;

storing in said memory means a positional data (C) of said magazine holder at a time of said alignment of said lowermost article storing section of said another magazine;

calculating a pitch (P) of the article storing sections and a distance (H) from the uppermost article storing section of said magazine to the lowermost article storing section of said another magazine from the equations:

$$P=(A-B)/(n-1)$$

$$H=B-C$$

wherein P=the pitch of the article storing sections, H is the distance from the uppermost article storing section of said magazine to the lowermost article storing section of said another magazine, A=positional data of said magazine holder at a time of said alignment of said lowermost article storing section, B=positional data of said magazine holder at a time of said alignment of said uppermost storing section, C=positional data of said magazine holder at a time of alignment of said lowermost article storing section of said another magazine and n=a number equal to the number of article storing sections of said magazine; and storing the pitch (P) and the distance (H) in said memory means.

* * * * *